(12) United States Patent
Schneegans et al.

(10) Patent No.: US 8,432,024 B2
(45) Date of Patent: Apr. 30, 2013

(54) INTEGRATED CIRCUIT INCLUDING BOND WIRE DIRECTLY BONDED TO PAD

(75) Inventors: Manfred Schneegans, Vaterstetten (DE); Lothar Koenig, Laaber (DE)

(73) Assignee: Infineon Technologies AG, Neubiberg (DE)

( * ) Notice: Subject to any disclaimer, the term of this patent is extended or adjusted under 35 U.S.C. 154(b) by 220 days.

(21) Appl. No.: 12/768,134

(22) Filed: Apr. 27, 2010

(65) Prior Publication Data
US 2011/0260307 A1 Oct. 27, 2011

(51) Int. Cl.
- *H01L 23/495* (2006.01)
- *H01L 23/48* (2006.01)
- *H01L 23/52* (2006.01)
- *H01L 29/40* (2006.01)
- *H01L 21/44* (2006.01)
- *H01L 21/48* (2006.01)
- *H01L 21/50* (2006.01)

(52) U.S. Cl.
USPC .... 257/676; 257/738; 257/741; 257/E21.509; 257/E23.023; 438/121

(58) Field of Classification Search .............. 257/676, 257/738, 741, E21.509, E23.023; 438/121, 438/612, 613
See application file for complete search history.

(56) References Cited

U.S. PATENT DOCUMENTS

| | | |
|---|---|---|
| 4,894,752 A | 1/1990 | Murata et al. |
| 5,023,697 A | 6/1991 | Tsumura |
| 5,298,793 A | 3/1994 | Kotani et al. |
| 6,207,551 B1 * | 3/2001 | Chungpaiboonpatana et al. ............ 438/617 |
| 6,515,373 B2 | 2/2003 | Barth |
| 6,698,646 B2 | 3/2004 | Chen et al. |
| 7,326,640 B2 | 2/2008 | Aoh et al. |
| 7,687,917 B2 * | 3/2010 | Ohto et al. ......... 257/774 |
| 2010/0052174 A1 * | 3/2010 | Bachman et al. ........ 257/762 |

FOREIGN PATENT DOCUMENTS

EP 1266715 12/2002

* cited by examiner

*Primary Examiner* — David S Blum
(74) *Attorney, Agent, or Firm* — Dicke, Billig & Czaja, PLLC

(57) ABSTRACT

An integrated circuit includes a chip including a copper bond pad metallization, and a copper bond wire including a copper ball. The copper ball is bonded directly to the copper bond pad.

9 Claims, 2 Drawing Sheets

INTEGRATED CIRCUIT INCLUDING BOND WIRE DIRECTLY BONDED TO PAD

BACKGROUND

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips or metal-oxide-semiconductor field effect transistor (MOSFET) semiconductor chips. The IGBT and MOSFET semiconductor chips have varying voltage and current ratings. Some power electronic modules also include additional semiconductor diodes (i.e., free-wheeling diodes) in the semiconductor package for overvoltage protection. Typically, to bond a Cu bond wire to a Cu pad within a power electronic module, the Cu pad is first plated with a Ni based metal layer followed by a layer of Pd. The Cu bond wire is then ball bonded to the Pd layer.

For these and other reasons, there is a need for the present invention.

SUMMARY

One embodiment provides an integrated circuit. The integrated circuit includes a chip including a copper bond pad metallization, and a copper bond wire including a copper ball. The copper ball is bonded directly to the copper bond pad.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
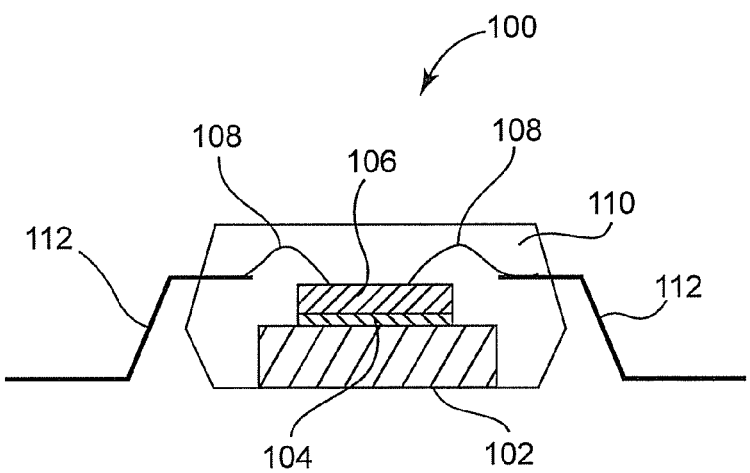
FIG. 1 illustrates a cross-sectional view of one embodiment of a module.

FIG. 1 illustrates a cross-sectional view of one embodiment of a module 100. In one embodiment, module 100 is a low power electronic module. Power electronic module 100 includes a leadframe substrate 102, a joint 104, a semiconductor chip or die 106, bond wires 108, leads 112, and a housing 110. Leadframe substrate 102 includes Cu, Al, or another suitable material. In one embodiment, leadframe substrate 102 is plated with Ni, Ag, Au, and/or Pd. In one embodiment, joint 104 is a solder joint that joins leadframe substrate 102 directly to semiconductor chip 106 using diffusion solder metals such as Cu—Sn, Au—Sn, or other suitable solders.

As used herein, the term "electrically coupled" is not meant to mean that the elements must be directly coupled together and intervening elements may be provided between the "electrically coupled" elements.

In one embodiment, leadframe substrate 102 has a thickness within the range of 125 µm to 200 µm. Leadframe substrate 102 is joined to semiconductor chip 106 via soldering or another suitable technique to provide joint 104. Housing 110 includes a mould material or another suitable material. Housing 110 surrounds leadframe substrate 102, joint 104, semiconductor chip 106, bond wires 108, and portions of leads 112. Semiconductor chip 106 is electrically coupled to leads 112 through bond wires 108. Bond wires 108 include Cu, Au, or another suitable material. In one embodiment, bond wires 108 are bonded to semiconductor chip 106 and leads 112 using thermosonic or ultrasonic wire bonding. In one embodiment, bond wires 108 are Cu and are directly bonded to Cu pads on semiconductor chip 106 via ball bonding (i.e., nail head bonding).

In a ball bonding process, a combination of heat, pressure, and/or ultrasonic energy is used to make a weld at each end of a wire. A high-voltage electric charge is applied to the wire to melt the tip of the wire, which forms into a ball due to the surface tension of the molten metal. The ball quickly solidifies and the ball is pushed onto the surface of a chip, which is typically heated. Ultrasonic energy may then be applied to the ball. The combined heat, pressure, and/or ultrasonic energy form a weld between the ball and the surface of the chip.

After the ball bonding, semiconductor chip 106 and bond wires 108 are annealed to recover the interface between each Cu pad and Cu bond wire as will be described below. In this way, a stress and void free connection between the Cu bond wire and the Cu pad is provided. In addition, since additional interface layers between the Cu pad and the Cu bond wire are not used, the number of processing steps and thus the cost to fabricate power electronic module 100 is reduced compared to typical power electronic modules. In another embodiment, a similar process is used to directly bond Au bond wires to Au pads on semiconductor chip 106.

Figure 2:
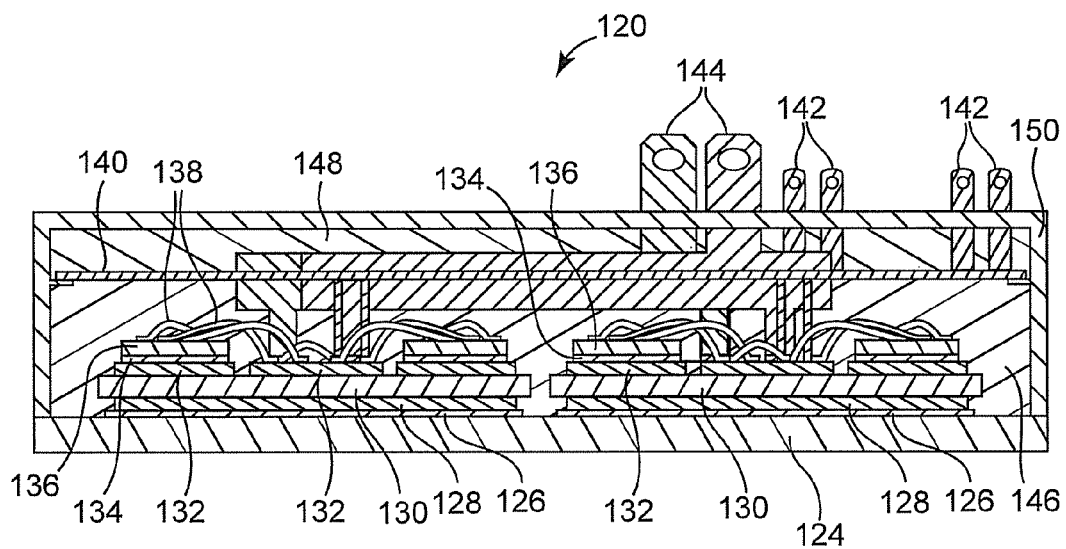
FIG. 2 illustrates a cross-sectional view of another embodiment of a module.

FIG. 2 illustrates a cross-sectional view of another embodiment of a module 120. In one embodiment, module 120 is a high power electronic module. Power electronic module 120 includes a metal baseplate 124, joints 126, metalized ceramic substrates 130 including metal surfaces or layers 128 and 132, joints 134, semiconductor chips 136, bond wires 138, circuit board 140, control contacts 142, power contacts 144, potting 146 and 148, and housing 150.

Ceramic substrates 130 include $Al_2O_3$, AlN, $Si_3N_4$, or other suitable material. In one embodiment, ceramic substrates 130 each have a thickness within a range of 0.2 mm to 2.0 mm. Metal layers 128 and 132 include Cu, Al, or another suitable material. In one embodiment, metal layers 128 and/or 132 are plated with Ni, Ag, Au, and/or Pd. In one embodiment, metal layers 128 and 132 each have a thickness within a range of 0.1 mm to 0.6 mm. In one embodiment, joints 126 are solder joints that join metal layers 128 directly to metal baseplate 124 using diffusion solder metals such as Cu—Sn, Au—Sn, or other suitable solders. In one embodiment, joints 134 are solder joints that join metal layers 132 directly to semiconductor chips 136 using diffusion solder metals such as Cu—Sn, Au—Sn, or other suitable solders.

Semiconductor chips 136 may also be electrically coupled to metal layers 132 through bond wires 138. Bond wires 138 include Cu, Au, or another suitable material. In one embodiment, bond wires 138 are bonded to semiconductor chips 136 and metal layers 132 using ultrasonic wire bonding. In one embodiment, bond wires 138 are Cu and are directly bonded to Cu pads on semiconductor chips 136 via ball bonding. After the ball bonding, semiconductor chips 136 and bond wires 138 are annealed to recover the interface between each Cu pad and Cu bond wire as will be described below. In this way, a stress and void free connection between the Cu bond wire and Cu pad is provided. In addition, since additional interface layers between the Cu pad and the Cu bond wire are not used, the number of processing steps and thus the cost to fabricate power electronic module 120 is reduced compared to typical power electronic modules. In another embodiment, a similar process is used to directly bond Au bond wires to Au pads on semiconductor chips 136. In one embodiment, a similar process is also used to directly bond Cu or Au bond wires to Cu or Au metal layers 132, respectively.

Metal layers 132 are electrically coupled to circuit board 140 and power contacts 144. Circuit board 140 is electrically coupled to control contacts 142. Housing 150 encloses joints 126, metallized ceramic substrates 130 including metal layers 128 and 132, joints 134, semiconductor chips 136, bond wires 138, circuit board 140, portions of control contacts 142, and portions of power contacts 144. Housing 150 includes technical plastics or another suitable material. Housing 150 is joined to metal baseplate 124. In one embodiment, a single metallized ceramic substrate 130 is used such that metal baseplate 124 is excluded and housing 150 is joined directly to the single metallized ceramic substrate 130.

Potting material 146 fills areas below circuit board 140 within housing 150 around joints 126, metallized ceramic substrates 130 including metal layers 128 and 132, joints 134, semiconductor chips 136, and bond wires 138. Potting material 148 fills the area above circuit board 150 within housing 150 around portions of control contacts 142 and portions of power contacts 144. Potting material 146 and 148 includes silicone gel or another suitable material. Potting material 146 and 148 prevents damage to power electronic module 120 by dielectrical breakdown.

Figure 3:
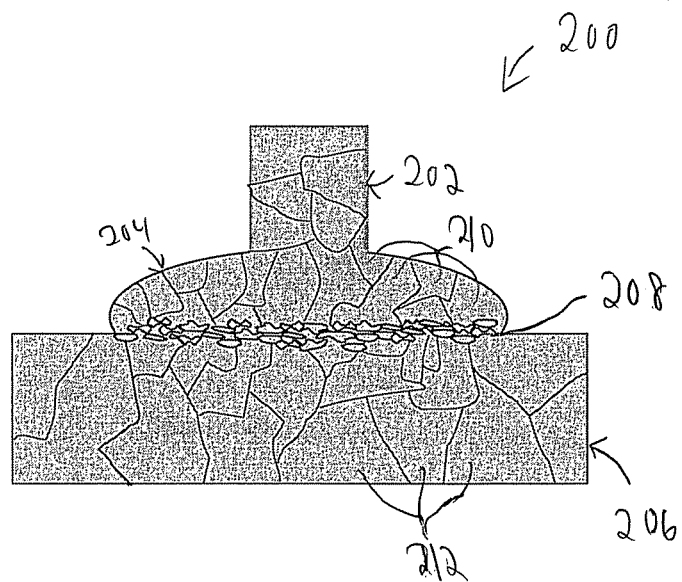
FIG. 3 illustrates a cross-sectional view of one embodiment of a connection between a bond wire and a bond pad after ball bonding.

FIG. 3 illustrates a cross-sectional view of one embodiment of a connection 200 between a bond wire 202 and a bond pad 206 after ball bonding. In one embodiment, bond wire 202 provides each bond wire 108 and bond pad 206 provides each bond pad on semiconductor chip 106 as previously described and illustrated with reference to FIG. 1. In another embodiment, bond wire 202 provides each bond wire 138 and bond pad 206 provides each bond pad on semiconductor chips 136 or each metal layer 132 as previously described and illustrated with reference to FIG. 2.

Prior to ball bonding bond wire 202 to bond pad 206, the semiconductor chip including bond pad 206 is attached to a leadframe or metallized ceramic substrate. In one embodiment, the bond pad 206 is cleaned to remove any contaminants and/or oxidation on the bond pad.

Next, bond wire 202 including a ball portion 204 is attached to a bond pad 206 via ultrasonic ball bonding or another suitable technique. In one embodiment as illustrated in FIG. 3, the entire area of ball 204 is bonded to bond pad 206 at an interface 208 between ball 204 and bond pad 206. In other embodiments, portions of the area of ball 204 are bonded to bond pad 206 at interface 208 while other portions of the area at interface 208 may be micro delaminated. Due to the ultrasonic impact, the grains in the area of interface 208 are refined or smaller than grains 210 in ball 204 and grains 212 in bond pad 206. While bond wire 202 is bonded to bond pad 206 without cracks and without delamination, the connection may degrade or fail during normal operation due to the grain refinement at interface 208.

In one embodiment, bond wire 202 is Cu and bond pad 206 is Cu such that at interface 208 the Cu ball directly contacts the Cu pad. In one embodiment, the Cu bond wire is ball bonded to the Cu pad in an ambient atmosphere. In another embodiment, an inert atmosphere, which includes a nitrogen atmosphere, a forming gas atmosphere, a formic acid atmosphere, or another suitable reductive atmosphere, is used to prevent oxidation of the Cu bond wire and/or Cu pad during the bonding process. In another embodiment, bond wire 202 is Au and bond pad 206 is Au such that at the interface 208 the Au ball directly contacts the Au pad.

Figure 4:
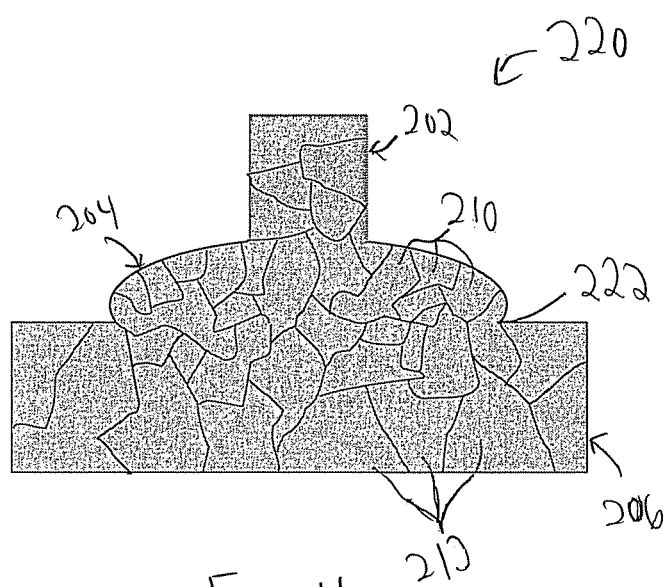
FIG. 4 illustrates a cross-sectional view of one embodiment of a connection between the bond wire and the bond pad after annealing.

FIG. 4 illustrates a cross-sectional view of one embodiment of a connection 220 between bond wire 202 and bond pad 206 after annealing. Bond wire 202 and bond pad 206 are annealed at a temperature between 200° C. and 400° C. for 2 to 20 hours. During annealing, the grains at interface 208 previously described and illustrated with reference to FIG. 3 recrystallize. After annealing, the interface 208 including the smaller grains as previously described and illustrated with reference to FIG. 3 is replaced by larger grains as indicated at 222 such that there is no longer a distinguishable interface within the metal between ball 204 and bond pad 206. The grains at 222 extend between ball 204 and bond pad 206. The annealing initiates interface recovery by growing the grains across the boundary between ball 204 and bond pad 206.

The annealing also simultaneously homogenizes the solder metallization on the semiconductor chip backside for diffusion solder metals such as Cu—Sn or Au—Sn used for attaching the semiconductor chip to a leadframe or metallized ceramic substrate. For example, the annealing may homogenize the solder joint 104 previously described and illustrated with reference to FIG. 1 or the solder joints 134 and/or solder joints 126 previously described and illustrated with reference to FIG. 2. In one embodiment, the annealing is carried out using a batch process where a plurality of devices are annealed simultaneously in a suitable furnace.

Embodiments provide power electronic modules or other suitable devices including Cu or Au bond wires directly bonded to Cu or Au bond pads, respectively. An annealing process recovers the interface between the ball and bond pad by curing the contact areas followed by recrystallization of the ball and bond pad such that new crystallites grow to exceed the former interface to create a new collective grain structure. The collective structure of the Cu or Au grains provides a cohesive matrix "ball-pad" without stress and without voids. In this way, an interface between the ball and bond pad is no longer distinguishable.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating an integrated circuit, the method comprising:
   providing a chip comprising a copper bond pad;
   attaching a copper bond wire directly to the copper bond pad; and
   annealing the copper bond pad and the copper bond wire to recrystallize copper grains at a contact area between the copper bond pad and the copper bond wire such that after annealing the copper bond pad and the copper bond wire are free from an interface,
   wherein annealing the copper bond pad and the copper bond wire comprises annealing the copper bond pad and the copper bond wire such that a solder metallization on the backside of the chip opposite the copper pad is homogenized.

2. The method of claim 1, wherein attaching the copper bond wire to the copper bond pad comprises ultrasonic ball bonding the copper bond wire to the copper bond pad.

3. The method of claim 1, wherein attaching the copper bond wire to the copper bond pad comprises attaching the copper bond wire to the copper bond pad in an ambient atmosphere.

4. The method of claim 1, wherein attaching the copper bond wire to the copper bond pad comprises attaching the copper bond wire to the copper bond pad in an inert nitrogen atmosphere.

5. The method of claim 1, wherein attaching the copper bond wire to the copper bond pad comprises attaching the copper bond wire to the copper bond pad in one of a reductive forming gas atmosphere and a formic acid atmosphere.

6. The method of claim 1, wherein attaching the copper bond wire to the copper bond pad comprises attaching the copper bond wire to the copper bond pad in one of a nitrogen atmosphere and a forming gas atmosphere.

7. The method of claim 1, wherein annealing the copper bond pad and the copper bond wire comprises annealing at a temperature between 200° C. and 400° C.

8. The method of claim 1, wherein annealing the copper bond pad and the copper bond wire comprises annealing for a period between 2 hours and 20 hours.

9. The method of claim 1, wherein annealing the copper bond pad and the copper bond wire comprises annealing the copper bond pad and the copper bond wire such that copper grains grow to extend between the copper bond pad and the copper bond wire.

* * * * *